(12) United States Patent
Lee et al.

(10) Patent No.: US 7,098,535 B2
(45) Date of Patent: Aug. 29, 2006

(54) SEMICONDUCTOR PACKAGE AND PACKAGING METHOD USING FLIP-CHIP BONDING TECHNOLOGY

(75) Inventors: Yeong-Gyu Lee, Kyunggi-do (KR); Seung-Do An, Kyunggi-do (KR)

(73) Assignee: Samsung Electro-Mechanics Co., Ltd., Suwon-si ( * ) Notice: Subject to any disclaimer, the term of this patent is extended or adjusted under 35 U.S.C. 154(b) by 0 days.

(21) Appl. No.: 10/953,120

(22) Filed: Sep. 28, 2004

(65) Prior Publication Data

US 2005/0269710 A1    Dec. 8, 2005

(30) Foreign Application Priority Data

Jun. 2, 2004    (KR) ............... 10-2004-0040066

(51) Int. Cl.
*H01L 23/48* (2006.01)
(52) U.S. Cl. ............ 257/738; 257/737; 257/774; 438/106
(58) Field of Classification Search ........ 257/737, 257/738, 774; 438/106
See application file for complete search history.

(56) References Cited

U.S. PATENT DOCUMENTS

| | | | |
|---|---|---|---|
| 5,293,511 A | | 3/1994 | Poradish et al. |
| 5,856,914 A | * | 1/1999 | O'Boyle ............ 361/761 |
| 6,303,986 B1 | | 10/2001 | Shook |
| 6,455,927 B1 | * | 9/2002 | Glenn et al. ............ 257/686 |
| 6,929,974 B1 | * | 8/2005 | Ding et al. ............ 438/106 |

* cited by examiner

*Primary Examiner*—Andy Huynh
(74) *Attorney, Agent, or Firm*—Christensen O'Connor Johnson Kindness PLLC

(57) ABSTRACT

A semiconductor package and packaging method using a flip-chip bonding technology is disclosed. In the semiconductor package and packaging method, the microelement array of a micro-device, for example, the micromirror array of a light modulator having micromirrors that are hyperfine elements, is sealed from the outside using flip-chip bonding technology. Thus, the microelement array is protected from the outside. The packaging method executes the packaging process using only the flip-chip bonding technology, without a wire-bonding technology, at a wafer level instead of a conventional individual semiconductor device level, thus increasing the bonding process efficiency. Furthermore, the electrode array pattern for supplying both electricity and control signals to the microelement array does not pass through a hermetic sealing layer, thus ensuring a well-sealed semiconductor package. The electrode array pattern is also finely formed to correspond to the microelement array which is extremely finely formed.

3 Claims, 12 Drawing Sheets

SEMICONDUCTOR PACKAGE AND PACKAGING METHOD USING FLIP-CHIP BONDING TECHNOLOGY

BACKGROUND OF THE INVENTION

1. Field of the Invention

The present invention relates, in general, to a semiconductor package and packaging method using a flip-chip bonding technology and, more particularly, to a semiconductor package and packaging method, in which a microelement array of a micro-device, for example, a micromirror array of a light modulator comprising micromirrors that are hyperfine elements, is sealed from the outside of the micro-device using a flip-chip bonding technology, so that the microelement array is protected from the outside.

2. Description of the Related Art

In the related art, various methods of packaging semiconductor devices or microoptical devices, which are designed and produced with hyperfine precision, have been proposed.

As an example of conventional semiconductor packaging technologies, U.S. Pat. No. 6,303,986 discloses a method and apparatus for sealing a hermetic lid to a semiconductor device.

As shown in FIG. 1, a conductive ribbon 100 having a metallic conductive/reflective mirror 102 is formed over an upper surface of a semiconductor substrate 104, with an air gap 106 defined between the ribbon 100 and the substrate 104. A conductive electrode 108 is placed under the ribbon 100 so that the air gap 106 is defined between the ribbon 100 and the conductive electrode 108. The conductive/reflective mirror 102 extends beyond the region of the mechanically active ribbon 100 and is configured as a bond pad 112 at its distal end. The semiconductor device is also passivated with an insulating protective layer 114 which does not cover the bond pad 112 or the ribbon structure 100 and 102. Control and power signals are coupled to the semiconductor device using conventional wire bonding structures 116.

Furthermore, a hermetic lid 122 made of a light transmissive material is joined to the semiconductor device. The lid 122 is formed to a size appropriate to fit concurrently over lid sealing regions 118, with a first solderable material 120 formed in a ring on the lid sealing regions 118 and a second solderable material 124 formed in a ring surrounding the periphery of one surface of the lid 122. A solder 126 is deposited onto the solderable material 124 so that the lid 122 is joined to the semiconductor device.

In the semiconductor packaging technique disclosed in the above-mentioned U.S. patent, the conductive electrode pattern for driving the semiconductor device passes through the hermetic sealing layer. Thus, the insulating protective layer must be provided in the semiconductor device, and thereby complicates the construction of the semiconductor device.

U.S. Pat. No. 5,293,511 discloses a method of packaging a semiconductor device. This U.S. patent discloses that anodic bonding, eutectic bonding, glass-frit bonding, soldering and epoxy bonding may be used to bond a cover to a base substrate.

However, the conventional semiconductor packaging techniques are problematic in that an excessive number of processes must be executed during a packaging process. Thus, the packaging process is complicated, and may result in an excessive number of defective products and an increase in production costs of the semiconductor packages.

Furthermore, the above-mentioned conventional semiconductor packaging techniques cannot package semiconductor devices as a wafer, but package the individual semiconductor devices one by one, thus complicating the packaging processes. Therefore, a reduction in production costs of the packages cannot be accomplished.

In addition, in the above-mentioned conventional semiconductor packaging techniques, a wire-bonding process must be executed prior to a flip-chip bonding process, which is capable of increasing the bonding process efficiency.

SUMMARY OF THE INVENTION

Accordingly, the present invention has been made keeping in mind the above problems occurring in the related art, and an object of the present invention is to provide a semiconductor package and packaging method, in which an electrode pattern for supplying both electricity and control signals to a microelement array does not pass through a hermetic sealing layer, thus ensuring a well-sealed semiconductor package.

Another object of the present invention is to provide a semiconductor package and packaging method, in which the packaging process is executed using only a flip-chip bonding technology without a wire-bonding technology, thus increasing the bonding process efficiency.

A further object of the present invention is to provide a semiconductor package and packaging method, in which the packaging process is executed at a wafer level instead of the conventional individual semiconductor device level.

Still another object of the present invention is to provide a semiconductor package and packaging method, in which an electrode array is finely formed to correspond to a microelement array, such as a micromirror array, which is extremely finely formed.

In order to achieve the above object, according to one aspect of the present invention, there is provided a semiconductor package, comprising: a micro-device provided with both an electrode array and a microelement array coupled to the electrode array; a transparent cover glass having a plurality of via holes corresponding to a plurality of electrodes of the electrode array of the micro-device, the cover glass being bonded to the micro-device so as to seal the microelement array from an outside; a sealing material provided on the micro-device to surround the microelement array and bond the cover glass and the micro-device together; and a conductive material filling each of the via holes of the cover glass to be connected at a first end thereof to the electrode array and at a second end thereof to an external control circuit, thus driving the microelement array in response to a control signal transmitted thereto from the external control circuit.

The semiconductor package may further comprise: a base substrate to which both the micro-device and the cover glass are bonded, the base substrate having an opening at a center thereof, with a solder ball array provided on the base substrate to be connected to the conductive material filling the via holes.

In the semiconductor package, the cover glass may be bonded to the base substrate so as to cover the opening of the base substrate, and the electrode array of the micro-device may be connected to the solder ball array via the conductive material filling the via holes.

According to another aspect of the present invention, there is provided a method of packaging a semiconductor element, comprising: preparing a micro-device wafer having a plurality of micro-devices, each of the micro-devices being provided with both an electrode array and a microelement array coupled to the electrode array; applying a sealing material on the micro-device wafer so that the sealing material surrounds the microelement array of each of the micro-devices; preparing a cover glass wafer having a plurality of transparent cover glasses; forming a via hole array in each of the cover glasses so that the via hole array corresponds to the electrode array; bonding the cover glass wafer to the micro-device wafer so that the microelement array of each of the micro-devices is sealed from an outside by the sealing material; filling via holes of the via hole array of each of the cover glasses of the cover glass wafer with a conductive material; and cutting the micro-device wafer and the cover glass wafer which are bonded together, so that unit packages are provided.

The packaging method may further comprise: preparing a base substrate having an opening at a center thereof; forming a solder ball array on the base substrate; and bonding both a micro-device and a cover glass on the base substrate so that the via hole array of the cover glass is connected to the solder ball array of the base substrate.

According to a further aspect of the present invention, there is provided a semiconductor package, comprising: a micro-device provided with both an electrode array and a microelement array coupled to the electrode array; a secondary substrate having an opening at a center thereof and being bonded to the micro-device, the secondary substrate being provided with both a first secondary electrode array connected to the electrode array of the micro-device and a second secondary electrode array connected to the first secondary electrode array; a sealing material provided on the micro-device to surround the microelement array and bond the secondary substrate and the micro-device together; and a cover glass bonded to the secondary substrate so that the cover glass covers the opening of the secondary substrate and seals the microelement array of the micro-device from an outside.

The semiconductor package may further comprise: a base substrate to which the micro-device, the secondary substrate and the cover glass are bonded, the base substrate having an opening at a center thereof to correspond to the opening of the secondary substrate, with a solder ball array provided on the base substrate to be connected to the second secondary electrode array of the secondary substrate.

According to still another aspect of the present invention, there is provided a method of packaging a semiconductor element, comprising: preparing a micro-device having a microelement array; applying a sealing material on the micro-device so that the sealing material surrounds the microelement array; preparing a secondary substrate having an opening at a center thereof; forming both a first secondary electrode array and a second secondary electrode array connected to the first secondary electrode array on the secondary substrate; bonding a transparent cover glass to the secondary substrate so that the cover glass covers the opening of the secondary substrate; and bonding the micro-device to the secondary substrate so that the microelement array of the micro-device is sealed from an outside by the sealing material.

The packaging method may further comprise: preparing a base substrate having an opening at a center thereof; forming a solder ball array on the base substrate to correspond to the second secondary electrode array of the secondary substrate; and bonding the secondary substrate on the base substrate so that the second secondary electrode array of the secondary substrate is connected to the solder ball array of the base substrate.

BRIEF DESCRIPTION OF THE DRAWINGS

The above and other objects, features and other advantages of the present invention will be more clearly understood from the following detailed description when taken in conjunction with the accompanying drawings, in which:

FIG. 3b is a sectional view taken along the line B–B' of FIG. 3a;

DETAILED DESCRIPTION OF THE INVENTION

Figure 1:
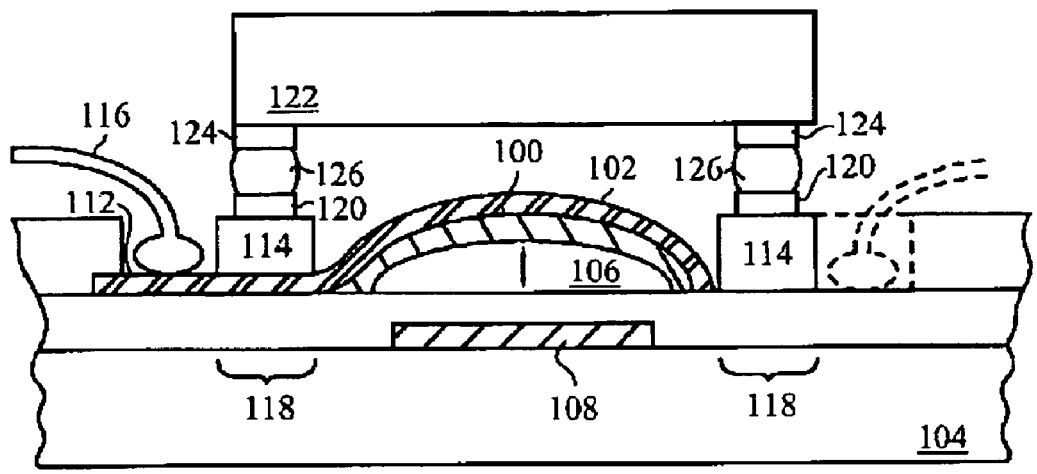
FIG. 1 is a sectional view of a conventional semiconductor package for microelements.

Reference will now be made in greater detail to preferred embodiments of the invention, examples of which are illustrated in the accompanying drawings. Wherever possible, the same reference numerals will be used throughout the drawings and the description to refer to the same or like parts.

FIGS. 2a through 5d illustrate a semiconductor package for micromirrors and a packaging method according to a first embodiment of the present invention.

Figure 2A:
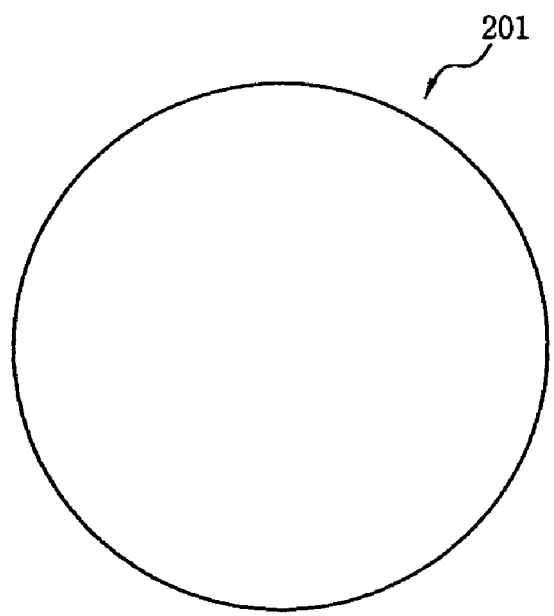
FIGS. 2a and 2b are a plan view and a side view, respectively, of a cover glass wafer used in a method of packaging micromirrors according to a first embodiment of the present invention.
Figure 2B:
Figure 2C:
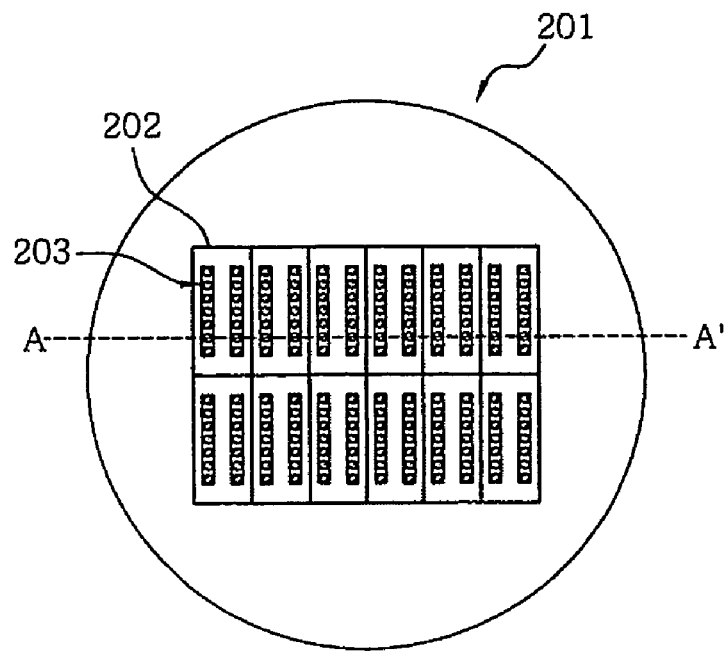
FIG. 2c is a plan view of the cover glass wafer of FIGS. 2a and 2b in which via holes are formed.

FIGS. 2a and 2b are a plan view and a side view, respectively, of a cover glass wafer used in a method of packaging the micromirrors according to the first embodiment of the present invention, respectively. FIG. 2c is a plan view of the cover glass wafer of FIGS. 2a and 2b in which via holes are formed, and FIG. 2d is a sectional view taken along the line A–A' of FIG. 2c.

To produce a semiconductor package for micromirrors according to the first embodiment of the present invention, a cover glass wafer 201 having a shape similar to the typical semiconductor wafer shown in FIGS. 2a and 2b is prepared.

Figure 2D:
FIG. 2d is a sectional view taken along the line A–A' of FIG. 2c.
Figure 3A:
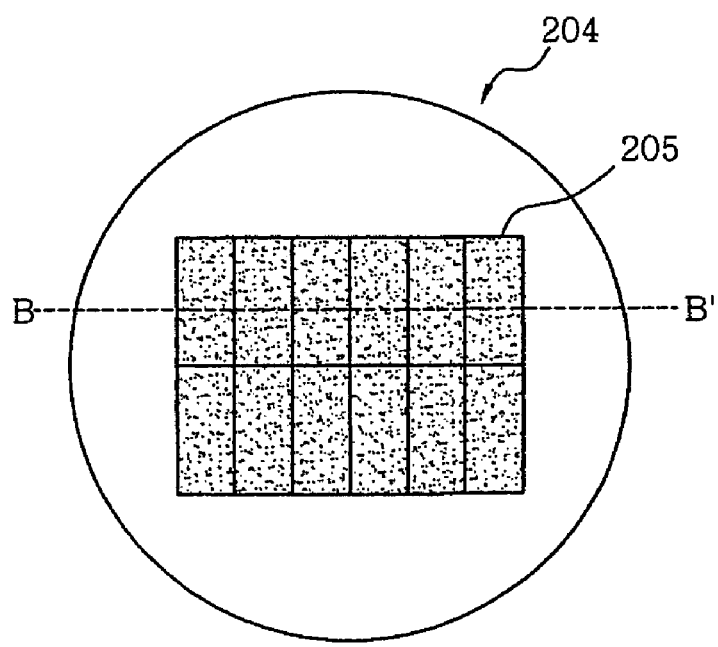
FIG. 3a is a plan view of a micro-device wafer used in the method of packaging the micromirrors according to the first embodiment of the present invention.
Figure 3B:
Figure 3C:
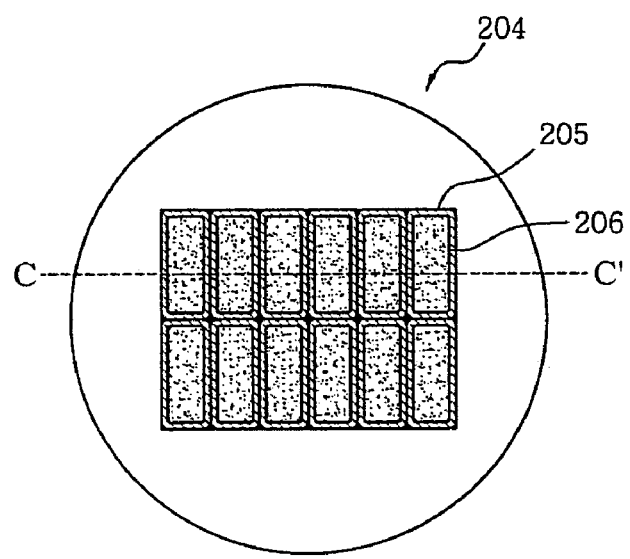
FIG. 3c is a plan view of the micro-device wafer of FIGS. 3a and 3b on which a sealing material is formed.
Figure 3D:
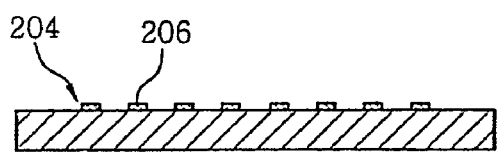
FIG. 3d is a sectional view taken along the line C–C' of FIG. 3c.

A cover glass pattern, having a plurality of transparent cover glasses 202 which corresponds to the micro-devices 205 of a micro-device wafer 204 shown in FIGS. 3c and 3d, is formed on the cover glass wafer 201 as shown in FIGS. 2c and 2d. In that case, each of the cover glasses 202 has the same size as each of the micro-devices 205.

A plurality of via holes 203 is formed in each of the cover glasses 202 through a sand blasting process. The via holes 203 are connected to the electrodes of an electrode array formed on each of the micro-devices 205. As shown in the sectional view of FIG. 2d, each of the via holes 203 has a tapered shape, with the diameter of the sand-blasted end of each via hole 203 being larger than the other end.

FIG. 3a is a plan view of a micro-device wafer 204 used in the method of packaging the micromirrors according to the first embodiment of the present invention. FIG. 3b is a sectional view taken along the line B–B' of FIG. 3a. FIG. 3c is a plan view of the micro-device wafer of FIGS. 3a and 3b on which a sealing material is formed. FIG. 3d is a sectional view taken along the line C–C' of FIG. 3c.

The micro-device wafer 204 of FIG. 3a has a plurality of micro-devices 205 which reflects or diffracts incident light in response to a voltage signal transmitted thereto from an external control circuit. Each of the micro-devices 205 has a microelement array, such as a micromirror array or a digital micromirror array. In FIG. 3a, for ease of illustration, the microelement array, such as the micromirror array or the digital micromirror array, is not shown.

The digital micromirror array is an optical element array constituting several million mirrors which are individually driven in response to a voltage signal controllably transmitted thereto from an external control circuit. Thus, the digital micromirror array diffracts or reflects incident light.

In a similar manner, the micromirror array is an optical element array constituting several million mirrors which reflect or diffract incident light.

The microelement arrays, such as the micromirror arrays or the digital micromirror arrays, may be formed on the micro-device wafer 204 through a conventional semiconductor processing technology, such as an etching process, a plating process or a laminating process.

The micro-devices 205 correspond to the cover glasses 202 of FIG. 2c, so that the micro-devices 205 have the same size as the cover glasses 202.

As shown in FIGS. 3c and 3d, a sealing material 206 is formed on the micro-device wafer 204 so that the sealing material 206 is formed around each of the micro-devices 205. In the present invention, the sealing material 206 serves as a bonding material to bond the micro-devices 205 to the cover glasses 202 when the micro-device wafer 204 and the cover glass wafer 201 are bonded together. The sealing material 206 formed on the micro-device wafer 204 surrounds the microelement array that is formed on each of the micro-devices 205, thus sealing the microelement array from the outside. In the present invention, epoxy or solders may be used as the sealing material 206.

Figure 4A:
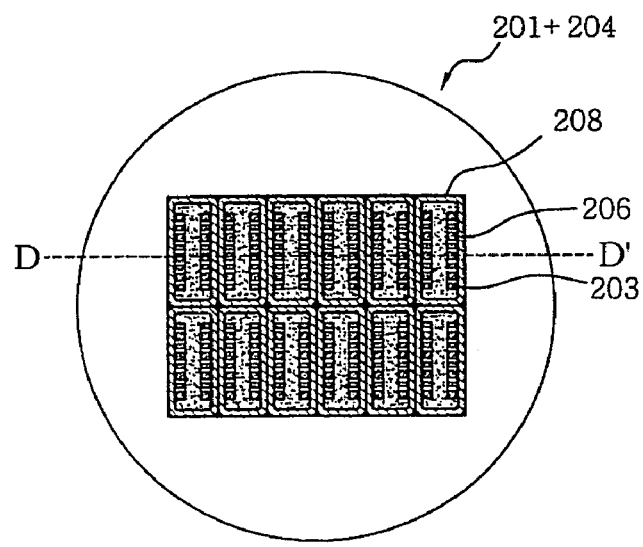
FIGS. 4a through 4f illustrate a process of producing a semiconductor package through the packaging method according to the first embodiment of the present invention.
Figure 4B:
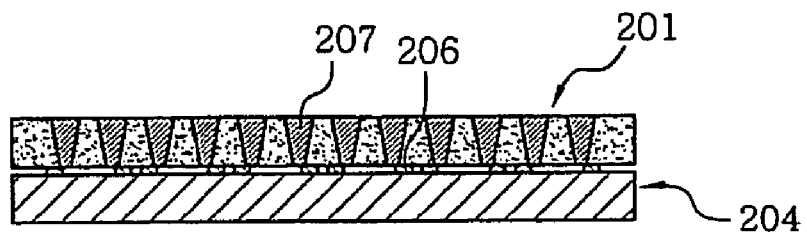

After the sealing material 206 is formed on the micro-device wafer 204 as shown in FIGS. 3c and 3d, the sand-blasted cover glass wafer 201 of FIGS. 2c and 2d and the micro-device wafer 204 are preliminarily bonded together and heated. When the preliminarily bonded wafers 201 and 204 are heated, the sealing material 206 is melted to bond the cover glass wafer 201 to the micro-device wafer 204 as shown in FIGS. 4a and 4b, in which FIG. 4a is a plan view of the bonded wafers 201 and 204, and FIG. 4b is a sectional view taken along the line D–D' of FIG. 4a. In that case, the size of each cover glass 202 of the cover glass wafer 201 is preferably the same as the size of each micro-device 205 of the micro-device wafer 204.

After the cover glass wafer 201 and the micro-device wafer 204 are bonded together as described above, a conductive material 207, such as a metal, fills the via holes 203 of the cover glasses 202 of the cover glass wafer 201. In that case, the filling of the via holes 203 with the conductive material 207 is preferably accomplished by sputtering the conductive material 207 on the surface of the cover glass wafer 201.

The sputtering of the conductive material 207 on the surface of the cover glass wafer 201 is preferably accomplished through DC sputtering, RF sputtering, bias sputtering or magnetron sputtering. Of the above-mentioned sputtering techniques, the magnetron sputtering, which is high speed sputtering, is most preferable.

After the sputtering, the surfaces of both the cover glass wafer 201 and the micro-device wafer 204 as well as the sputtered via holes 203 are preferably cleaned.

Figure 4C:
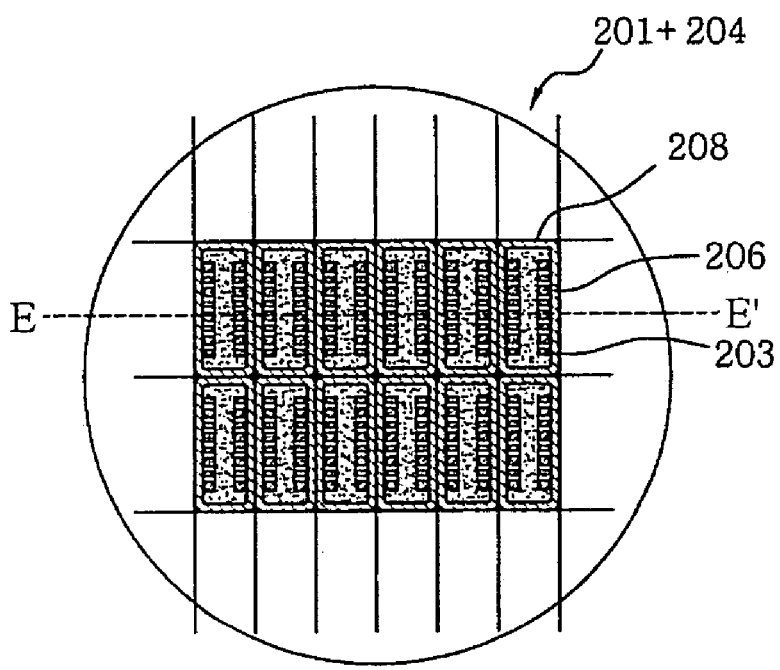
Figure 4D:
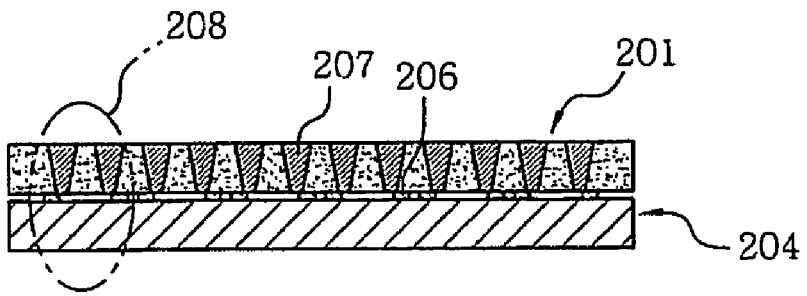

After the cleaning, the cover glass wafer 201 and the micro-device wafer 204, which are bonded together, are cut into pieces as shown in FIGS. 4c and 4d, thus providing a plurality of unit packages 208. Of the drawings, FIG. 4c is a plan view, and FIG. 4d is a sectional view taken along the line E–E' of FIG. 4c.

Figure 4E:
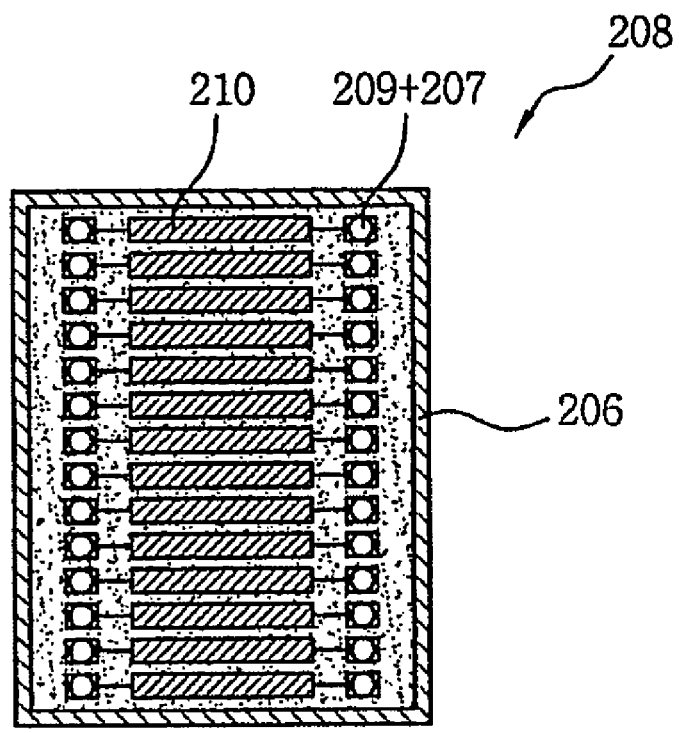
Figure 4F:
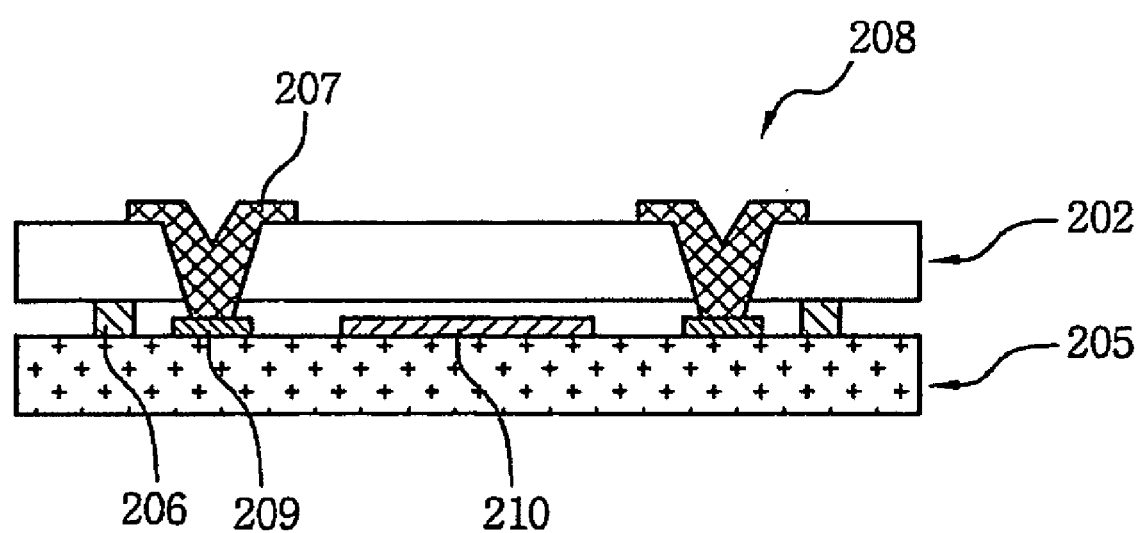

FIGS. 4e and 4f are a plan view and a sectional view of a unit package 208, which is provided by the cutting process of FIG. 4c, respectively.

The microelement array 210 sealed in the unit package 208 of FIGS. 4e and 4f is driven in response to a signal transmitted thereto from the external control circuit through the electrode array 209. The electrodes of the electrode array 209 are placed on the micro-device 205 at positions corresponding to the via holes 203 of the cover glass 202.

In the embodiment of the present invention, the microelement array 210 preferably comprises a micromirror array or a digital micromirror array.

The microelement array 210 placed on the micro-device 205 at a position between opposite rows of electrodes of the electrode array 209 is formed through a conventional semiconductor patterning technique. The microelement array 210 is driven in response to a voltage signal transmitted from the external control circuit thereto through the electrodes of the electrode array 209, thus diffracting or reflecting incident light. The via holes 203 correspond to the electrodes of the electrode array 209 so that, when the cover glass 202 is bonded to the micro-device 205, the conductive material 207 filling the via holes 203 is electrically connected to the electrode array 209.

The microelement array 210 included in the unit package 208 of FIGS. 4e and 4f is driven upwards and downwards in response to the voltage signal applied thereto through both the conductive material 207 and the electrode array 209.

In another embodiment of the present invention, the microelement array 210 may comprise another type of microelement array or a pattern array which is designed to execute a specified function, in place of the micromirror array to diffract or reflect incident light.

Figure 5A:
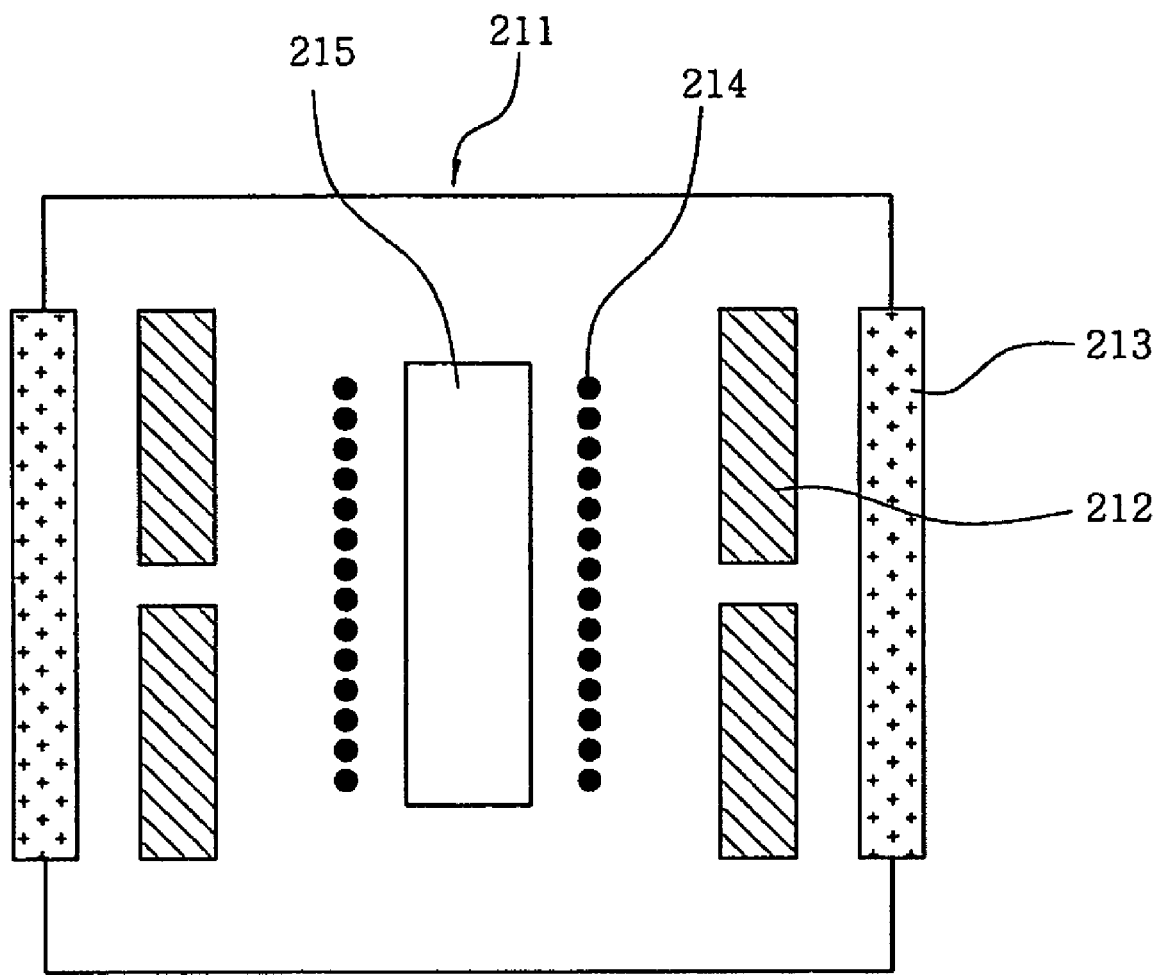
FIGS. 5a through 5d illustrate a process of bonding the semiconductor package according to the first embodiment of the present invention on a base substrate.

FIG. 5a shows a base substrate 211 to which the unit package 208 is bonded. The base substrate 211 is provided with an opening 215 at a center thereof. Furthermore, a plurality of IC-chips 212 for executing specified functions, along with connectors 213, is mounted to the base substrate 211. Of course, the IC-chips 212 and the connectors 213 may be variously designed according to desired functions of the package, without being limited to the design of the IC-chips and connectors shown in FIG. 5a.

A solder ball array 214 is formed on the base substrate 211 to bond the unit package 208 to the base substrate 211 through a flip-chip bonding technology. The solder balls of the solder ball array 214 correspond to the via holes 203 of the cover glass 202 of the package 208.

Figure 5B:
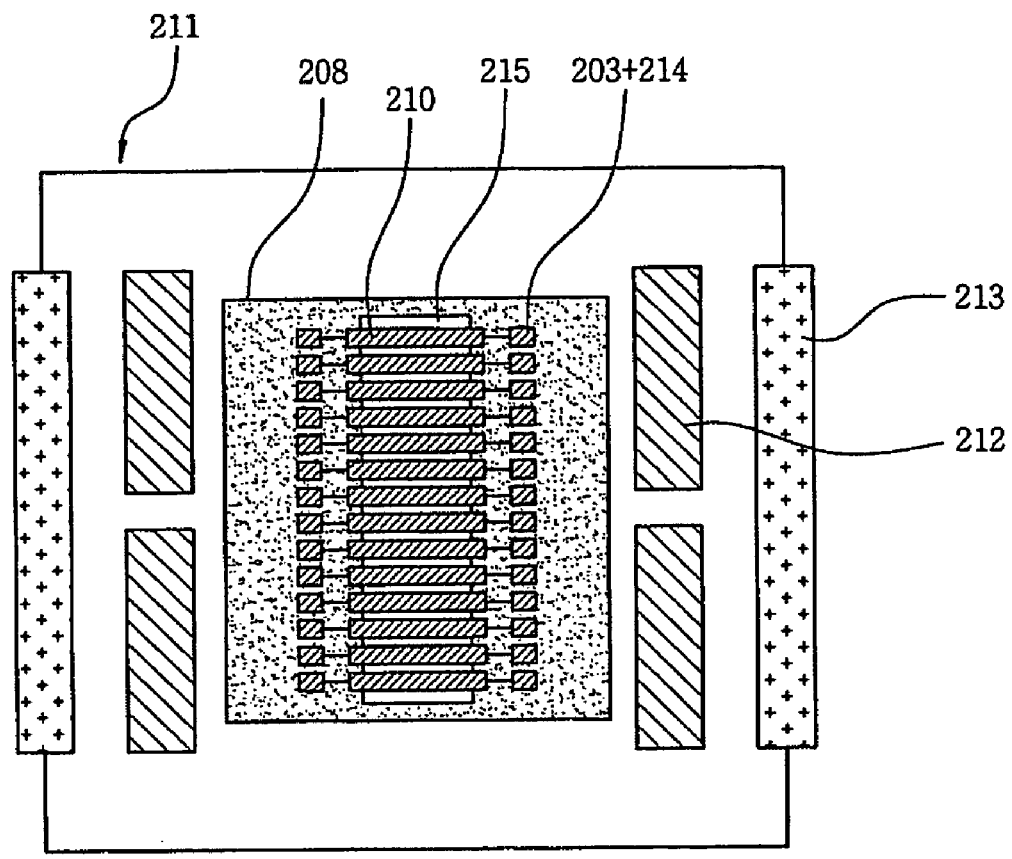

As shown in FIG. 5b, the unit package 208 is bonded to the base substrate 211 through the flip-chip bonding technology. In that case, the unit package 208 of FIGS. 4e and 4f is bonded to the base substrate 211 such that the cover glass 202 faces the base substrate 211. Furthermore, the via holes 203 of the cover glass 202 of the package 208 are aligned with the solder balls of the solder ball array 214 of the base substrate 211.

The bonding of the package 208 to the base substrate 211 is preferably executed through a so-called "reflow process". In the reflow process, the solder balls of the solder ball array 214 are heated to be melted, thus having an appropriate viscosity. Thereafter, the package 208 and the base substrate 211 are compressed to be bonded together prior to being cooled.

Figure 5C:
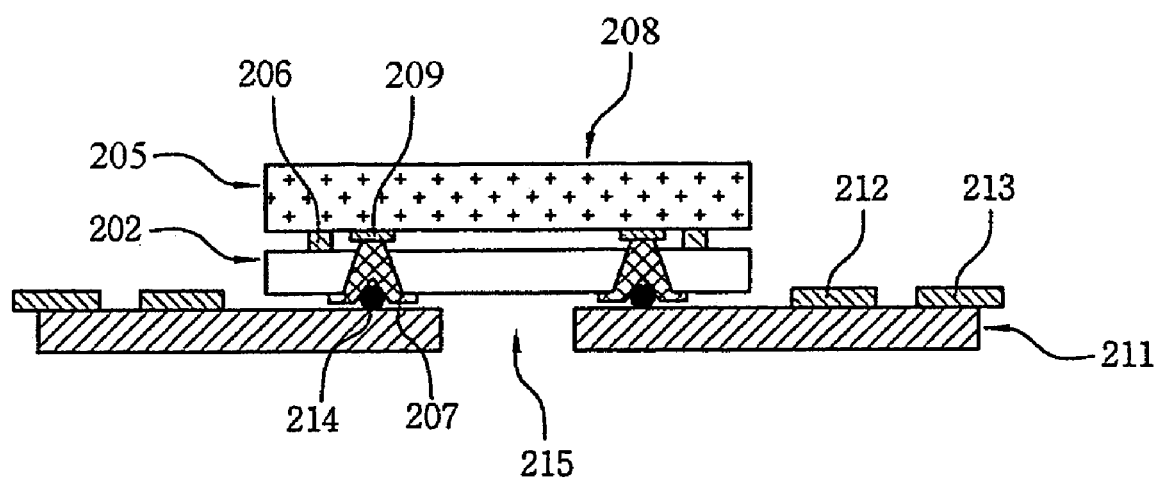

FIG. 5c is a sectional view of the package 208 which is bonded to the base substrate 211 through the reflow process of the present invention.

Figure 5D:
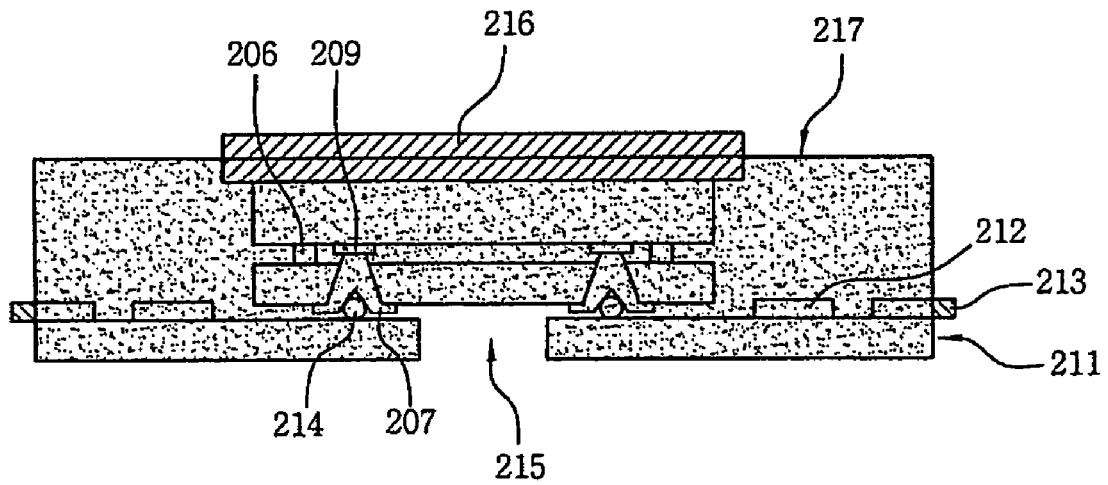

After the package 208 is bonded to the base substrate 211 through the reflow process as described above, continuous processes may be executed to complete the packaging. That is, a heat-dissipating panel 216 may be mounted to the package 208 and both the package 208 and the base substrate 211 may be encapsulated by an outer casing 217 to provide a complete package as shown in FIG. 5d. In that case, the outer casing 217 may comprise a metal case or an epoxy molding compound (EMC).

FIGS. 6a through 6f illustrate a semiconductor package and a packaging method according to a second embodiment of the present invention.

Figure 6A:
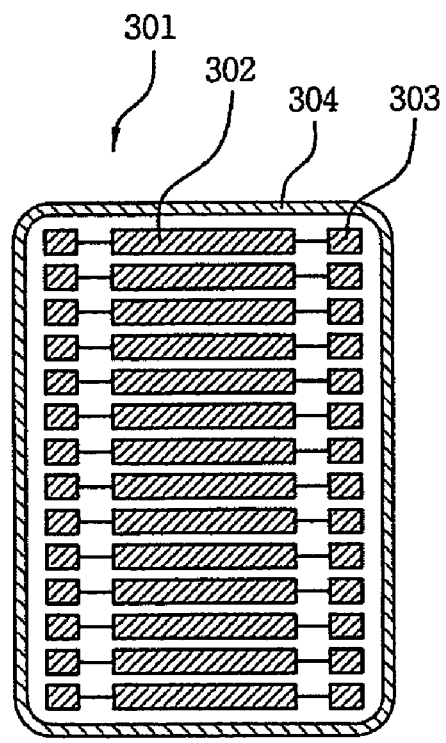
FIGS. 6a through 6f illustrate a semiconductor package and a packaging method according to a second embodiment of the present invention.

FIG. 6a shows a micro-device 301 which has both a microelement array 302 and an electrode array 303 thereon. A sealing material 304 is formed on the micro-device 301 by printing or dispensing epoxy so that the epoxy sealing material 304 surrounds both the microelement array 302 and the electrode array 303. In that case, the electrode array 303 drives the microelement array 302. In the present invention, epoxy or solder is preferably used as the sealing material 304.

In the second embodiment, the microelement array 302 diffracts or reflects incident light and may be a micromirror array or a digital micromirror array.

The digital micromirror array is an optical element array constituting several million mirrors which are individually driven in response to a voltage signal controllably transmitted thereto from a external control circuit. Thus, the digital micromirror array diffracts or reflects incident light.

In a similar manner, the micromirror array is an optical element array constituting several million mirrors which reflect or diffract incident light.

Figure 6B:
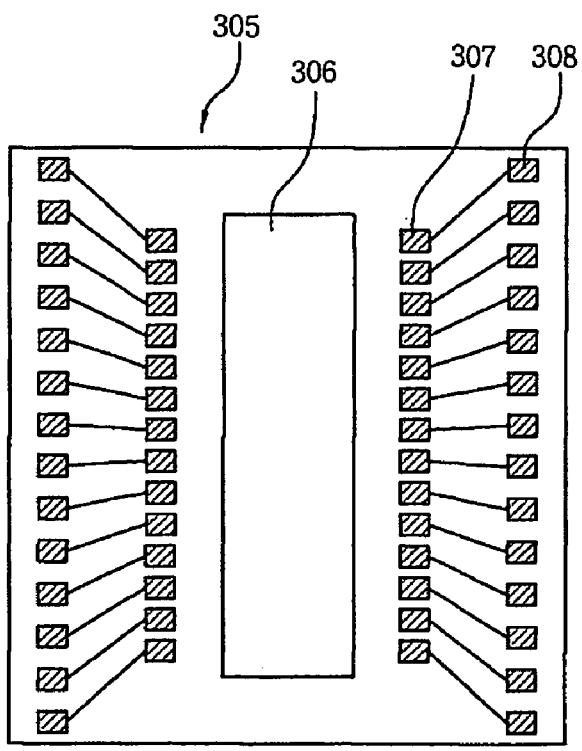

FIG. 6b shows a secondary substrate 305 to which the micro-device 301 is bonded. The secondary substrate 305 is made of silicon and has an opening 306 at the center thereof. The secondary substrate 305 further includes a first secondary electrode array 307 and a second secondary electrode array 308 connected to the first secondary electrode array 307.

The first secondary electrode array 307 may be formed through a conventional electrode patterning technology other than sand blasting technology if the selected patterning technology can form a fine electrode pattern. For example, a desired electrode pattern may be formed by etching the secondary substrate coated with an etching resist printed with a designated pattern, and removing the etching resist from the secondary substrate after the etching process. The second secondary electrode array 308 may be formed in a similar manner as the first secondary electrode array 307.

The electrodes of the second secondary electrode array 308 are distributed over an area larger than those of the first secondary electrode array 307 as shown in FIG. 6b. Thus, the electrodes of the first secondary electrode array 307 are more closely distributed than the electrodes of the second secondary electrode array 308.

In the second embodiment, the first secondary electrode array 307, in place of the via holes 203 of the cover glass 202 in the first embodiment of FIGS. 2a through 5d, is connected to the electrode array 303 of the micro-device 301. In the first embodiment of FIGS. 2a through 5d, the via holes 203 of the cover glass 202 are limited in their density because the via holes 203 to be connected to the electrodes of the electrode array 209 of the micro-device 205 must be formed in the cover glass 202 through a sand blasting technology. However, in the second embodiment of FIGS. 6a through 6d, the first secondary electrode array 307 is formed through an etching process so that the second embodiment provides a secondary substrate having a high-density electrode array. Thus, the electrode density of the electrode array 303 of the micro-device, which is bonded to the first secondary electrode array 307, can be highly increased.

Figure 7A:
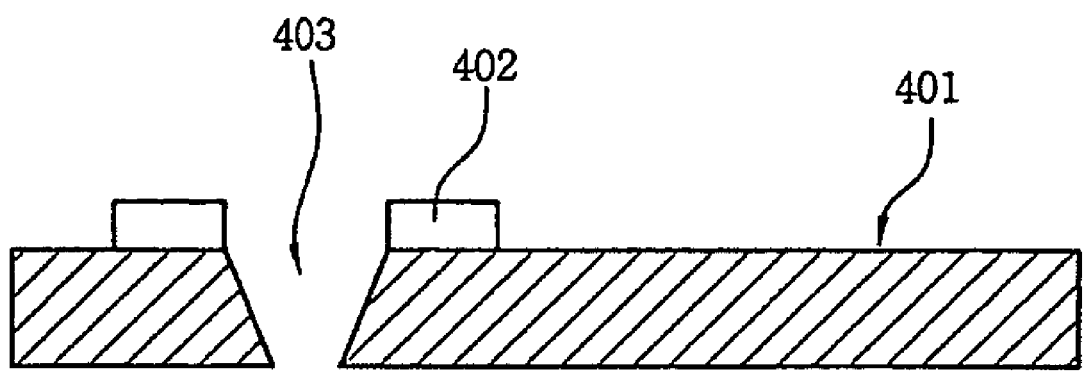
FIG. 7a is a sectional view illustrating a via hole formed through a sand blasting process.
Figure 7B:
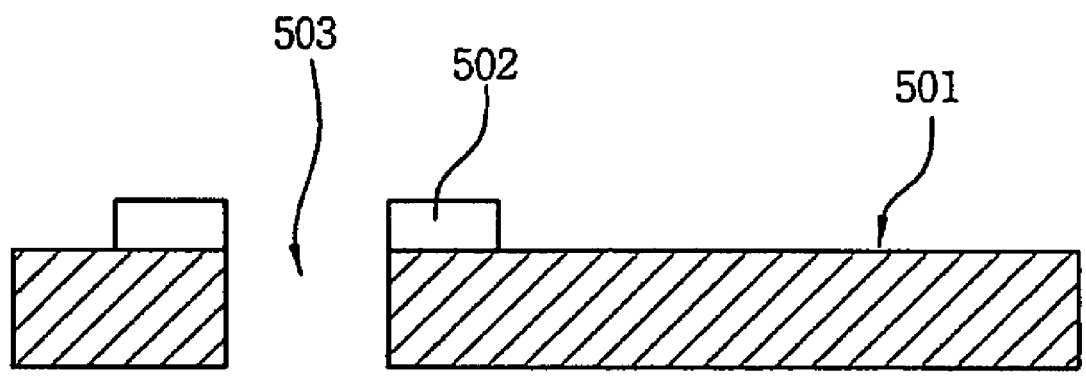
FIG. 7b is a sectional view illustrating a via hole formed through an etching process.

FIG. 7a is a sectional view illustrating a via hole 403 formed through a sand blasting process, and FIG. 7b is a sectional view illustrating a via hole 503 formed through an etching process.

When an upper surface of the glass substrate 401 is subjected to a sand blasting process, a tapered via hole 403 is formed in the glass substrate 401, with a circuit pattern 402 formed around the via hole 403, as shown in FIG. 7a. However, the via holes 403 formed in the glass substrate 401 through the sand blasting process are limited in their density due to the tapered shape, so that a fine circuit pattern cannot be provided. In that case, it should be understood that the formation of the via holes 403 in the glass substrate 401 may be accomplished only through the sand blasting process because of the properties of the glass substrate.

In the meantime, when a via hole 503 is formed in a substrate 501 through an etching process, it is possible to form the via hole 503 with the inside surface being perpendicular to opposite surfaces of the substrate 501 as shown in FIG. 7b. Thus, the density of the via holes 503 formed in the substrate 501 is increased so that a fine circuit pattern 502 can be provided. Of course, to form the via holes 503 in the substrate 501 through the etching process, the substrate 501 must be made of a material which can be etched.

Returning to FIG. 6c, a cover glass is bonded to the secondary substrate 305 of FIG. 6b so that the cover glass covers the opening 306 of the secondary substrate 305. Thereafter, the micro-device 301 of FIG. 6a is bonded to the secondary substrate 305. The micro-device 301 reflects or diffracts incident light in response to a voltage signal transmitted thereto from an external control circuit.

In that case, the micro-device 301 is preferably bonded to the secondary substrate 305 through an anodic bonding technology which is a wafer bonding technology used for bonding silicon wafers together. However, it should be understood that the bonding of the micro-device 301 to the secondary substrate 305 may be accomplished through adhesive bonding or soldering instead of anodic bonding.

In the related art, the wafer bonding technologies have been used to hermetically bond silicon wafers together or to hermetically bond a silicon wafer to another wafer, such as a quartz wafer or a glass wafer. Thus, the wafer bonding technologies have been more preferably used in the processes of producing micro-electro-mechanical systems (MEMS) than the processes of producing IC-devices. If generally described, the wafer bonding technologies are classified into fusion bonding, in which high temperature heat of 1000° C. or higher is applied to wafers, and anodic bonding in which high voltage of several hundred volts is applied to the wafers. Furthermore, in an effort to reduce heat temperature or voltage to be applied to the wafers during a wafer bonding process, the combination of fusion bonding and anodic bonding has been actively studied. The wafer bonding technologies integrate two micro-processed wafers into a single structure by bonding them together, thus overcoming the problems experienced in another conventional bonding technology in which the wafers are cut into devices and the individual devices are bonded together one by one. Of course, the wafer bonding technologies must avoid any new problems caused by the high temperature or the high voltage, or caused by the process of aligning the wafers.

The anodic bonding technology is a wafer bonding technology which has been preferably used for bonding a silicon substrate to a glass substrate, having a coefficient of thermal expansion similar to the silicon substrate, in a process of producing micro-sensors. Generally, Pyrex glass (Corning Glass 7740), which has been preferentially and widely used in anodic bonding, contains predetermined amounts of sodium (Na), potassium (K), etc., so that, when the Pyrex glass is heated to 200° C. or higher, the elements of the Pyrex glass are electrically charged to easily move in response to applied voltage. Thus, when a voltage of 600V or higher is applied to both a silicon substrate and a glass substrate after aligning the silicon and glass substrates with each other, electrically charged elements quickly move in the glass substrate to strongly charge the interface between the silicon and glass substrates, thus bonding the silicon and glass substrates together. As the above-mentioned anodic bonding can provide a stable silicon structure, the anodic bonding has been preferably used in a variety of processes for producing MEMS.

Figure 6C:
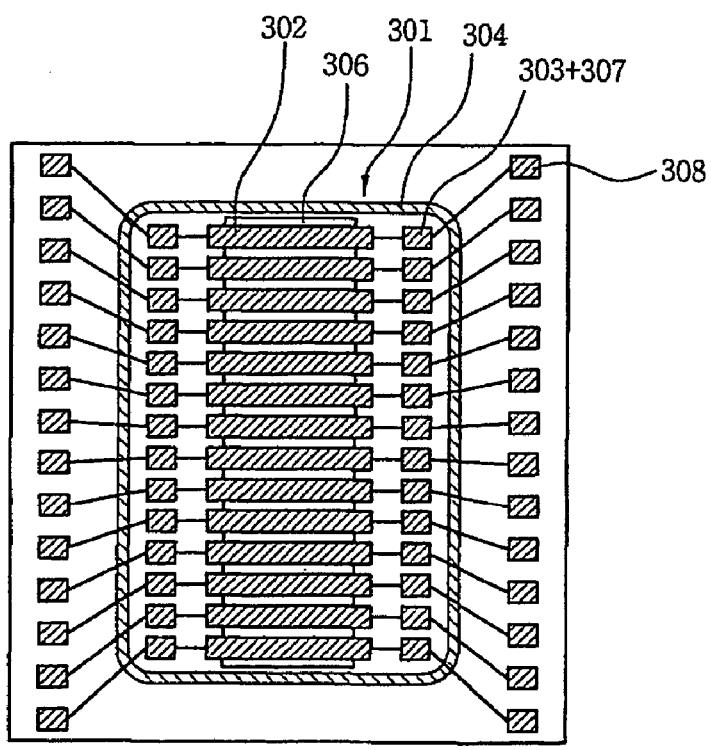
Figure 6D:
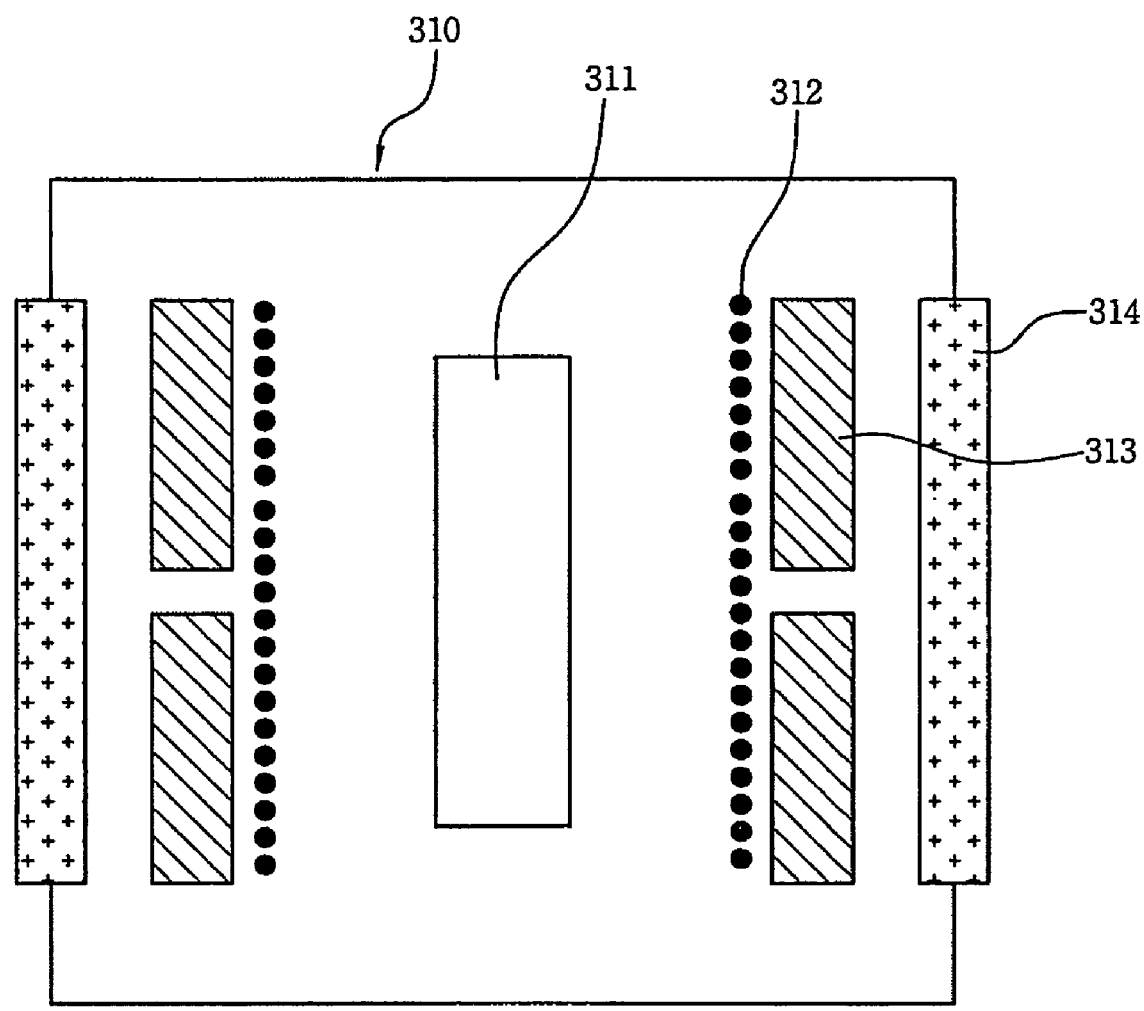

FIG. 6d shows a base substrate 310 to which the micro-device 301 is bonded. The base substrate 310 is provided with an opening 311 at a center thereof. Furthermore, a plurality of IC-chips 313 for executing specified functions and bond pads 314 for bonding another substrate or another micro-device to the base substrate 310 are mounted to the base substrate 310. In addition, a solder ball array 312 is formed on the base substrate 310 to bond the micro-device 301 to the base substrate 310 through a flip-chip bonding technology. In that case, the solder ball array 312 corresponds to the second secondary electrode array 308 of the secondary substrate 305.

Figure 6E:
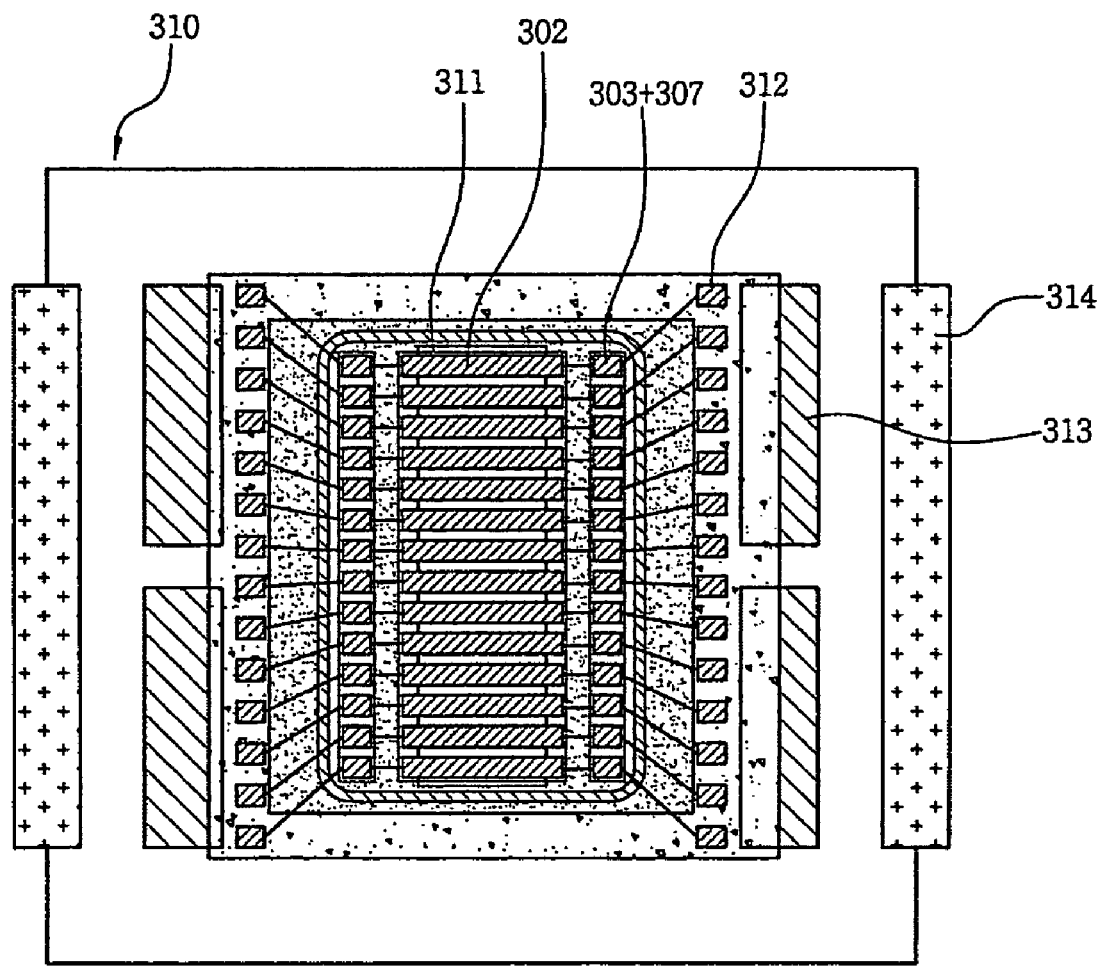

As shown in FIG. 6e, the micro-device 301 and the secondary substrate 305 of FIG. 6c are bonded to the base substrate 310 through the flip-chip bonding technology. In that case, the second secondary electrode array 308 of the secondary substrate 305 is aligned with the solder ball array 312 of the base substrate 310. Furthermore, the bonding of the second secondary electrode array 308 to the solder ball array 312 is preferably executed through a reflow process.

Figure 6F:
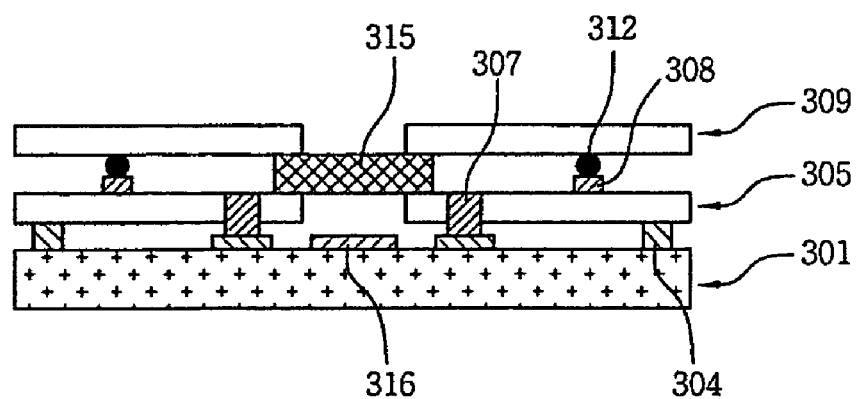

FIG. 6f is a sectional view of the semiconductor package according to the second embodiment of the present invention.

As described above, the second embodiment can increase, using an appropriate circuit patterning process, such as an etching process, the electrode density of the first secondary electrode array 307 according to the density of both the microelement array 302 and the electrode array 303 of the micro-device 301. Thus, the second embodiment provides a high-density microelement array 302.

As apparent from the above description, unlike conventional semiconductor packaging technologies, in which a microelement array is packaged through a flip-chip bonding process after wires bonded to the microelement array through a wire-bonding process are lead to the outside, the semiconductor packaging method of the present invention executes a microelement packaging process using only a flip-chip bonding process without a wire-bonding process, thus increasing the bonding process efficiency.

In the semiconductor package and packaging method of the present invention, the electrode array pattern for supplying both electricity and control signals to the microelement array does not pass through a hermetic sealing layer, thus ensuring a well-sealed semiconductor package.

Furthermore, in the semiconductor package and packaging method of the present invention, the packaging process is executed at a wafer level instead of the conventional individual semiconductor device level.

In the semiconductor package and packaging method of the present invention, the electrode array pattern is finely formed to correspond to the microelement array, such as a micromirror array, which is extremely finely formed.

Although preferred embodiments of the present invention have been described for illustrative purposes, those skilled in the art will appreciate that various modifications, additions and substitutions are possible, without departing from the scope and spirit of the invention as disclosed in the accompanying claims.

What is claimed is:

1. A semiconductor package, comprising:
    a micro-device provided with both an electrode array and a microelement array coupled to the electrode array;
    a transparent cover glass having a plurality of via holes corresponding to a plurality of electrodes of the electrode array of the micro-device, the cover glass being bonded to the micro-device so as to seal the microelement array from an outside;
    a sealing material provided on the micro-device to surround the microelement array and bond the cover glass and the micro-device together;
    a conductive material filling each of the via holes of the cover glass to be connected at a first end thereof to the electrode array and at a second end thereof to an external control circuit, thus driving the microelement array in response to a control signal transmitted thereto from the external control circuit; and
    a base substrate to which both the micro-device and the cover glass are bonded, the base substrate having an opening at a center thereof, with a solder ball array provided on the base substrate to be connected to the conductive material filling the via holes.

2. The semiconductor package according to claim 1, wherein the cover glass is bonded to the base substrate so as to cover the opening of the base substrate, and the electrode array of the micro-device is connected to the solder ball array via the conductive material filling the via holes.

3. A method of packaging a semiconductor element, comprising:
    preparing a micro-device wafer having a plurality of micro-devices, each of the micro-devices being provided with both an electrode array and a microelement array coupled to the electrode array;
    applying a sealing material on the micro-device wafer so that the sealing material surrounds the microelement array of each of the micro-devices;

preparing a cover glass wafer having a plurality of transparent cover glasses;
forming a via hole array in each of the cover glasses so that the via hole array corresponds to the electrode array;
bonding the cover glass wafer to the micro-device wafer so that the microelement array of each of the micro-devices is sealed from an outside by the sealing material;
filling via holes of the via hole array of each of the cover glasses of the cover glass wafer with a conductive material;

cutting the micro-device wafer and the cover glass wafer which are bonded together, so that unit packages are provided;
preparing a base substrate having an opening at a center thereof;
forming a solder ball array on the base substrate; and
bonding both a micro-device and a cover glass on the base substrate so that the via hole array of the cover glass is connected to the solder ball array of the base substrate.

* * * * *

UNITED STATES PATENT AND TRADEMARK OFFICE
CERTIFICATE OF CORRECTION

PATENT NO. : 7,098,535 B2 Page 1 of 1
APPLICATION NO. : 10/953120
DATED : August 29, 2006
INVENTOR(S) : Y.-G. Lee et al.

It is certified that error appears in the above-identified patent and that said Letters Patent is hereby corrected as shown below:

<u>COLUMN</u>     <u>LINE</u>

10                     "an outside;" should read --the outside;--
(Claim 1,   line 8)

11                     "an outside" should read --the outside--
(Claim 3,   line 17)

Signed and Sealed this

First Day of May, 2007

JON W. DUDAS
*Director of the United States Patent and Trademark Office*